United States Patent
Dirscherl et al.

(10) Patent No.: US 7,412,593 B2
(45) Date of Patent: Aug. 12, 2008

(54) PROCESSOR FOR PROCESSING A PROGRAM WITH COMMANDS INCLUDING A MOTHER PROGRAM AND A SUB-PROGRAM

(75) Inventors: Gerd Dirscherl, Munich (DE); Berndt Gammel, Markt Schwaben (DE); Michael Smola, Munich (DE)

(73) Assignee: Infineon Technologies AG (DE)

( * ) Notice: Subject to any disclaimer, the term of this patent is extended or adjusted under 35 U.S.C. 154(b) by 282 days.

(21) Appl. No.: 11/093,276

(22) Filed: Mar. 28, 2005

(65) Prior Publication Data

US 2005/0201195 A1  Sep. 15, 2005

Related U.S. Application Data

(63) Continuation of application No. PCT/EP03/10597, filed on Sep. 23, 2003.

(30) Foreign Application Priority Data

Sep. 27, 2002  (DE)  ............................... 102 45 367

(51) Int. Cl.
- G06F 7/38 (2006.01)
- G06F 9/44 (2006.01)
- G06F 15/00 (2006.01)

(52) U.S. Cl. .................. 712/242; 712/243; 712/228
(58) Field of Classification Search ............... 712/242, 712/243, 228
See application file for complete search history.

(56) References Cited

U.S. PATENT DOCUMENTS

| | | | |
|---|---|---|---|
| 4,338,663 A * | 7/1982 | Strecker et al. | 712/228 |
| 4,445,173 A * | 4/1984 | Pilat et al. | 712/228 |
| 4,493,027 A * | 1/1985 | Katz et al. | 712/228 |
| 5,325,494 A | 6/1994 | Imai et al. | |

(Continued)

FOREIGN PATENT DOCUMENTS

| GB | 2 007 891 A | 5/1979 |
|---|---|---|
| WO | WO-00/62165 A2 | 10/2000 |

OTHER PUBLICATIONS

VAX11/780 "Architecture Handbook", 1977, Digital Equipment Corporation, ☐☐Pertinent pp. 2-1 to 2-9, 8-18 to 9-1, B-12 to C-5.*

(Continued)

*Primary Examiner*—Eddie P Chan
*Assistant Examiner*—Idriss Alrobaye
(74) *Attorney, Agent, or Firm*—Dickstein, Shapiro, LLP.

(57) ABSTRACT

A processor for processing a program with commands, which has a mother program with a sub-program jump command and a sub-program, which is to be processed in response to the sub-program jump command. The processor has a command processor, which is adapted in the mother program upon occurrence of the sub-program jump command, to extract back-up information about data required in the mother program after processing the sub-program from the sub-program jump command, to back-up data required in the mother program after execution of the sub-program based on the back-up information, to extract a destination address from the sub-program jump command, which refers to the sub-program, and to effect the continuation of the processing of the program with the sub-program based on the destination address.

17 Claims, 6 Drawing Sheets

U.S. PATENT DOCUMENTS 5,414,864 A * 5/1995 Koizumi ................ 712/228
6,212,630 B1 * 4/2001 Takayama et al. .......... 712/242
6,438,740 B1 * 8/2002 Broder et al. ............ 712/228

OTHER PUBLICATIONS

"An Ada Code Generator for VAX 11/780 with Unix" by Mark Sherman, Andy Hisgen, David, Alex, Lamb, Jonathan Rosenberg. Publisher: ACM, 1980.*

Jack W. Davidson & David B. Whalley; "Methods for Saving and Restoring Register Values across Function Calls"; Software-Practice and Experience, vol. 21(2), Feb. 1991, pp. 149-165; XP008036353.

P.E. Cohen; "An abundance of registers"; SIGPLAN Notices, vol. 23, No. 6, Jun. 1998, pp. 24-34; XP008036341.

Intel 80386: Programmer's Reference Manual 1986; Chapter 6 Protection; Intel Corporation 1987 CG-May 26, 1987.

* cited by examiner

PROCESSOR FOR PROCESSING A PROGRAM WITH COMMANDS INCLUDING A MOTHER PROGRAM AND A SUB-PROGRAM

CROSS-REFERENCE TO RELATED APPLICATION

This application is a continuation of copending International Application No. PCT/EP03/10597, filed on Sep. 23, 2003, which designated the United States and was not published in English.

BACKGROUND OF THE INVENTION

1. Field of the Invention

The present invention relates to processors in general and particularly to the administration of intermediate results in jumps to a sub-program.

2. Description of the Related Art

The operation of processors is controlled by programs, which consist of several commands. In the easiest case, the processor processes the program from beginning to end in a linear way according to a predetermined processing sequence, without passing through any program parts several times. Therefore, the program is stored and disposed, respectively, in a linear way in the physical memory or, in the case of a virtual memory addressing, in the virtual address space.

For avoiding the repeated storage of identical program parts with an identical sequence of commands, however, programs have at least so-called sub-program jump commands (CALLs), and when they occur, processing is continued in part of the program, a so-called sub-program, until a return occurs in the sub-program, whereupon the execution of the program is continued at the location which succeeds the sub-program jump command according to the processing sequence. In that way, the memory required for storing the program is reduced to the one required for storing the commands of the sub-program as well as the jump commands compared to the memory, which would be required to store the complete sub-program each time.

During processing the program, the processor generates intermediate results, which it writes into internal registers of the processor. These internal registers are, on the one hand, faster writable and readable, respectively, than external memories available for the processor, such as a RAM or an EEPROM, but are, on the other hand, very limited in their memory capacity, since they are expensive. To really allow full access to the fast internal memory of the processor during processing the sub-program, it has to be made sure during the programming of the program, that those intermediate results in internal registers, which are still required in the mother and main program, respectively, after processing the sub-program, will not get lost by overwriting these internal registers during processing the sub-program.

A first and at the same time easiest possibility for backing-up intermediate results in the internal registers during the length of the sub-program is to provide memory commands in the program code in processing sequence prior to the respective program branch command and the jump command, respectively, which store the register contents sequentially, register by register into a memory location secure from overwriting, such as an external RAM. One example of such a memory command is, for example, the command MOV <memory location address>, Rx, wherein the common notation for commands is used and the operand <memory location address> indicates the address of the memory location, where the register content of the register Rx is to be stored. A disadvantage of this procedure is that one or according to data organization, even several commands are required per intermediate result to be stored and per register, whose content is to be stored, respectively, so that the length of the program code and, more exactly, the requirement of code memory per program branch is increased significantly.

An improved possibility for backing-up register content for the length of the sub-program is to use specialized commands for pre-storage of the register contents to be backed-up, which store the register contents to be backed-up not individually but in groups or at once in the back-up memory provided therefore. An example for such a memory command is, for example, a multiple push operation and a multiple filling operation, respectively, such as, written in common notation, Push <Rx, Ry, Rz . . . >, whereby the register contents of the register s Rx, Ry, Rz . . . are entered into a stack provided therefore. Although the requirement of command lines in the program code is reduced to a single memory command by summing-up several memory commands, there are still at least two command lines required for preparing the processing of the sub-program, namely the multiple memory command and the program branch command.

A last possibility for backing-up register contents for the length of a sub-program is an automatic recognition of the data and register content to be backed-up, respectively, by logging those registers which have been written with intermediate results prior to the jump command. According to this possibility, the register contents of the accordingly recognized internal registers are automatically counted to the "data to be conserved" when a branch command occurs, i.e. backed-up to a stack or another back-up memory, which is not as much subject to the size restrictions of the internal registers. Although in the last-named possibility of data back-up, merely one command line and one branching command, respectively, is required in that part of the program from which the jump to the sub-program is performed and which is referred to as mother program below, it is a disadvantage that in the automatic recognition it cannot be considered, which of the data stored in the internal registers during the execution of the mother program have to be available after processing the sub-program and which not, so that the back-up storage for backing up these data is wasted and a larger than absolutely required back-up memory is required, respectively.

As has already been mentioned, a return command in the sub-program corresponds to the jump command in the mother program and, upon occurrence of the return command processing is continued at the command succeeding the sub-program jump command in the mother program. Here, commands for restoring the data needed for further processing the mother program are required, in correspondence to the commands of the pre-data back-up in the jump command.

A possibility for data restoration corresponding to the above first described possibility are simple loading commands, such as MOV Rx, <back-up location address>, which are equivalent to the memory commands. A variation corresponding to the second possibility uses, for example, a multiple-pop-command and a multiple-output-command, respectively, such as pop <Rx, Ry, Rz . . . >, whereupon a number of register contents corresponding to the number of registers Rx, Ry, Rx . . . is taken from the stack and entered into these registers. In the case of using the last-named possibility for data back-up of jump commands, the register contents to be restored are automatically restored upon occurrence of the return command (such as RET) and written into respective internal registers, respectively, wherein the information, which of the registers have been backed-up automatically and, in other words, how many register contents are to be taken from the back-up memory, and into which registers same are to be written, are already stored in the back-up memory together with the register content to be backed-up during processing the "automatic jump command".

The previous discussion with regard to the return command from the mother program to the sub-program has illustrated that the problem of the requirement of command lines for backing-up data to be restored in the registers occurs again after processing the sub-program, whereby the requirement of command lines is doubled in total.

Although the problem of the additional requirement of command lines when calling sub-programs is only a small problem in view of the rapid development of the memory technologies in most applications, such as personal computer applications, there are memory restrictive fields of application where the program memory for storing the program code is extremely limited in multiple ways. One example of such a field of application are chip cards, such as used in cashless payment systems. Industrial standards determine the available chip area, which again limits the available memory capacity. The problem is increased by high security requirements, which require extremely expensive and thus large-area crypto processors for the calculation of the extremely computation-intensive cryptoalgorithms. Additionally, chip cards are required to have a high degree of user friendliness, part of which is a terminal time period, which is as short as possible. To enable fast terminal time periods, cryptographical computations have to be parallelized, which requires a trade-off between required chip area, required computation time of the crypto co-processors and underlying key lengths. Above that, some chip card applications provide a transfer of program codes, namely from terminal to chip card, so that here, due to the limited transfer rate, a reduced program code length is desirable for shorter terminal time periods. Accordingly, the latter holds true, of course, for other fields of application, such as the transfer of program codes to satellites or the like.

SUMMARY OF THE INVENTION

It is an object of the present invention to provide a concept for data back-up in sub-program jump commands, which is more efficient.

In accordance with a first aspect, the present invention provides a processor for processing a program with commands, which has a mother program with a sub-program jump command and a sub-program, which is to be executed in response to the sub-program jump command, having a command processor adapted to, upon the occurrence of the sub-program jump command in the mother program, extract, from the sub-program jump command, back-up information about data required in the mother program after processing the sub-program; back-up, based on the back-up information, the data required in the mother program after processing the sub-program; extract a destination address referring to the sub-program from the sub-program jump command; and effecting, based on the destination address, the processing of the program to be continued with the sub-program.

In accordance with a second aspect, the present invention provides a method for processing a program with commands having a mother program with a sub-program jump command and a sub-program, the program executed in response to the sub-program jump command, having the steps of, upon occurrence of the sub-program jump command in a mother program, by the command processor, extracting, from the sub-program jump command, back-up information about data required in the mother program after processing the sub-program; backing-up, based on the back-up information, data required in the mother program after processing the sub-program; extracting a destination address from the sub-program jump command, the destination address referring to the sub-program; and effecting, based on a destination address, the processing of the program to be continued with the sub-program.

In accordance with a third aspect, the present invention provides a computer program with a program code for executing the above-mentioned method, when the computer program runs on a computer.

BRIEF DESCRIPTION OF THE DRAWINGS

Preferred embodiments of the present invention will be discussed below with reference to the accompanying drawings. They show.

DESCRIPTION OF THE PREFERRED EMBODIMENTS

The present invention is based on the knowledge that a both less time-consuming and less memory-consuming manipulation of sub-programs can be achieved by not only integrating the destination address as operands in the sub-program jump command, but also back-up information about which data are still required in the mother program after processing the sub-program. Separate commands in the program, once for the back-up of the data to be backed up and another for the actual jump to the sub-program are not required, whereby both the processing time of the program and the program length can be reduced. Additionally, the compiler and programmer, respectively, can influence particularly the choice of data to be backed up and the memory locations, whose contents are to be backed up, respectively, other than the "automatic jump" commands described in the introduction of the description, so that the memory required for backing-up data to be backed up only has to be "loaded" with data which are absolutely required in the mother program after processing the sub-program.

Figure 1:
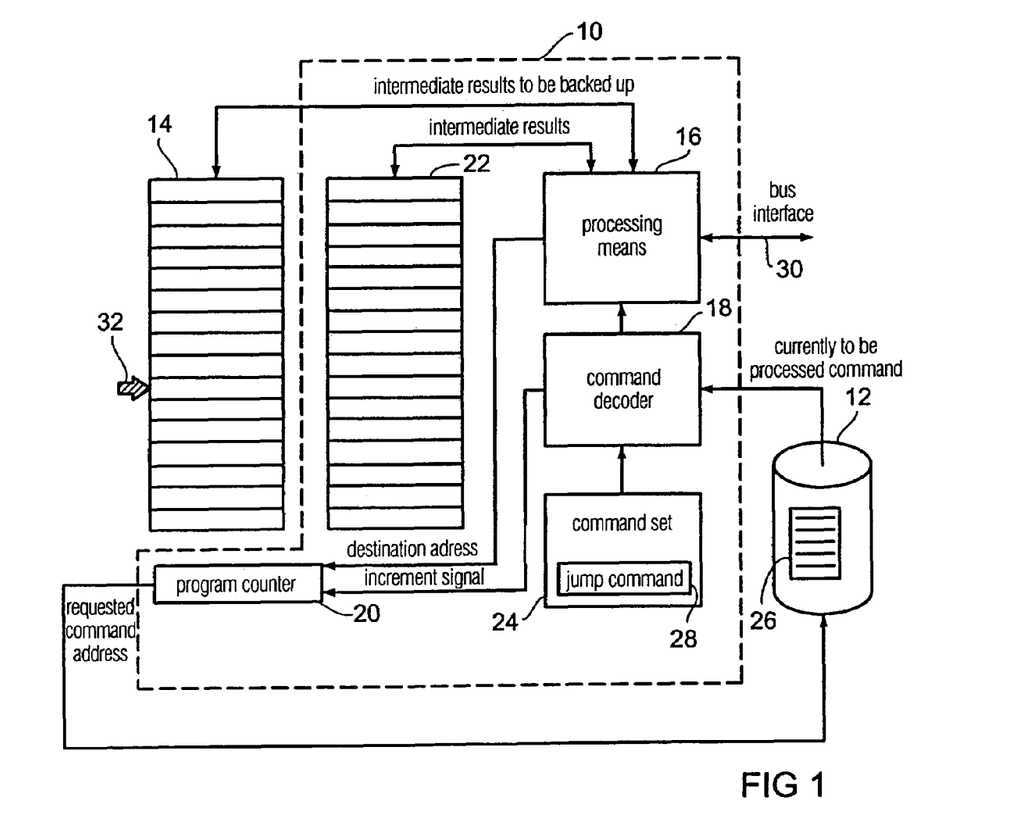
FIG. 1 a block diagram of the processor and its environment according to an embodiment of the present invention.

FIG. 1 shows an embodiment of a processor and its environment according to an embodiment of the present invention, where the inventive concept of data back-up in the sub-program jumps can be implemented. As a precaution, it should be noted that the environment of FIG. 1 is merely exemplary and serves for a better understanding. While, consequently, in the embodiment of FIG. 1, mainly the manipulation of physical addresses is provided, the present invention can be used in the same way within a virtual memory addressing.

FIG. 1 shows a processor 10 with a program memory 12, such as an EEPROM or a ROM and a stack 14. The processor 10 comprises a command processing means 16, a command decoder 18, a program counter 20 and a set of internal registers 22. Further, the processor comprises a command set 24. The command decoder 18 is connected to the program memory 12, to obtain from it the respective current command to be processed from the commands of the program 26 to be processed, which is stored in the program memory 12.

The command decoder 18 further knows about the command set 24. The command set 24 comprises all possible command types and command operations, respectively, which the processor 10 can process. Every command of the program 26 and thus also the currently to be processed command corresponds to one of the command operations of the command set 24 and differs from it merely by the determined values of its operands, which are only determined according to number, size and purpose in the command operation. For a clear distinction of the commands and the command operations, respectively, a clear operation code is associated to every command and every command operation, respectively, on the basis of which the command decoder 18 can distinguish every incoming command to be processed according to its command type and command operation, respectively. A different number of operands can be associated to every command operation, which is required for performing the command operation. Thus, the command decoder 18, which can conclude the command type of the incoming command due to the operation code, knows the number of operands, which belong to the respectively incoming command. Thus, after the input of the operation code of the currently to be processed command, the command decoder 18 requests as many operands of the command from memory 12 as belong to the currently to be processed command due to its command type, whereupon reading out the current command is completed. Among other things, the command set 24 comprises a sub-program jump command operation 28, which will be discussed below in more detail.

Further, the command decoder 18 is connected to the command processing means 16 to notify it of the command type of the currently to be processed command as well as its operands required for processing it.

Further, the command decoder 18 is connected to the program counter 20 to send an increment signal to the program counter 20 upon receiving the currently to be processed command. The program counter 20 contains a value, which always points to the position of the program 26 and always points to the address of that command in the program 26, respectively, which is to be processed next according to the processing sequence. Since the commands have different lengths due to their different structure, i.e. with or without operand and operands, respectively, and thus take up a different amount of address positions in the program 26, the increment signal notifies the program counter 20 about the required number of address increments, to point to the next command in program 26.

The processing means 16 processes the commands depending on command type, and, if existing, with the help of the operands. During the program execution, the processing means 16 writes, among others, processor intermediate results and data, respectively, into a multiple register 22, which, exemplarily, consists of 16 registers in the present example. The command processing means 16 has also a bus interface 30 to a bus (not shown), via which the command processing means 16 can communicate with periphery units, controlled by the commands of the program 26, such as, in the case of a chip code, with a cryptoprocessor, a terminal interface or the like.

Additionally, the command processing means 16 is connected to the back-up stack 14 for backing up the data in the register 22 during the duration of processing the sub-program, as it will be discussed below in more detail, to enter (push) those data into it, which shall be available after processing the sub-program, wherein a back-up stack pointer, which is illustrated in FIG. 1 as an arrow 32, always points to the last entered date.

The previous description of the structure as well as the operating mode of the processor 10 concerned merely the linear processing of program 26, without the occurrence of jump commands, such as the ones of the sub-program jump command operation 28. If the currently to be processed command is a real jump command (JMP) with the aim to continue processing the program 26 by the processor 10 at a different position, the command processing means 16 writes the destination address obtained in the jump command as operands directly into the program counter 20, so that the next to be processed command is read from this destination address and subsequently provided to the command decoder 18. If the currently to be processed command is a jump command with return characteristic, like the sub-program jump command 28 described below, with the aim to interrupt processing program 26 by processor 10 for processing a sub-program, first, the command processing means 16 stores the address entered in the program counter 20 in a return address stack and, only subsequently, writes the destination address contained in the jump command as operand into the program counter 20, so that the next to be processed command is read from this destination address and subsequently provided to the command decoder 18, and the return address can later be read from the stack upon occurrence of a return command.

In the following, the inventive mode of operation of the processor 10 is described with reference to the further figures for the case that the currently to be processed command is a sub-program jump command and corresponds to a sub-program jump command operation 28, respectively.

Before FIGS. 3-6 will be discussed in more detail, the structure of the sub-program jump command and the sub-program jump command operation, respectively, is described according to an embodiment of the present invention. The term "sub-program jump command operation", as it is used in the present specification, differs from the term "sub-program jump command" by the fact that sub-program jump command operation indicates rather the command definition in contrary to the other command definitions of the command operations in the command set of the processor, while a sub-program jump command corresponds to an actual formation or instance of the sub-program jump command operation in the program to be processed. In other words, the value/values of the operands are not defined in a command operation, while in a command all operands are defined.

Figure 2:
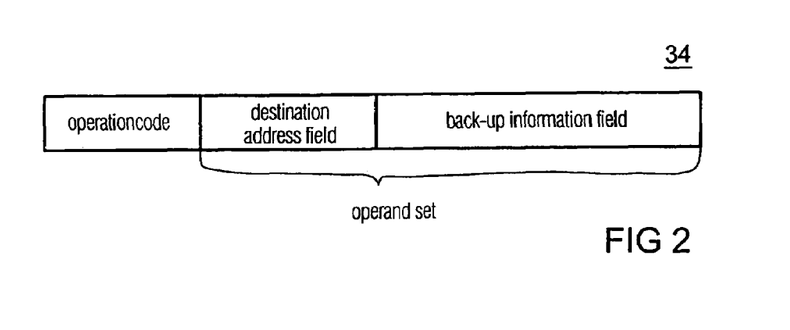
FIG. 2 a schematic structure of a sub-program jump command according to an embodiment of the present invention.

For simplification reasons, in the following merely the term sub-program jump command is used, even when the command operation is meant, since this is the common use of language. The sub-program jump command, as generally indicated with 34 in FIG. 2, consists mainly of two parts, an operation code in the beginning and a subsequent operand set. The operand set, again, consists of a destination address field and a back-up information field. The operation code serves for the clear identification of the sub-program jump command 34. This, the command decoder (18 in FIG. 1) of the processor obtains first when reading out a command 34, whereupon the command decoder already expects the operand set from the destination address in the destination address field and back-up information in the back-up information field. Consequently, the command decoder requests further bytes from the command storage, until the full operand set of the command 34 is loaded from the command memory.

Figure 3:
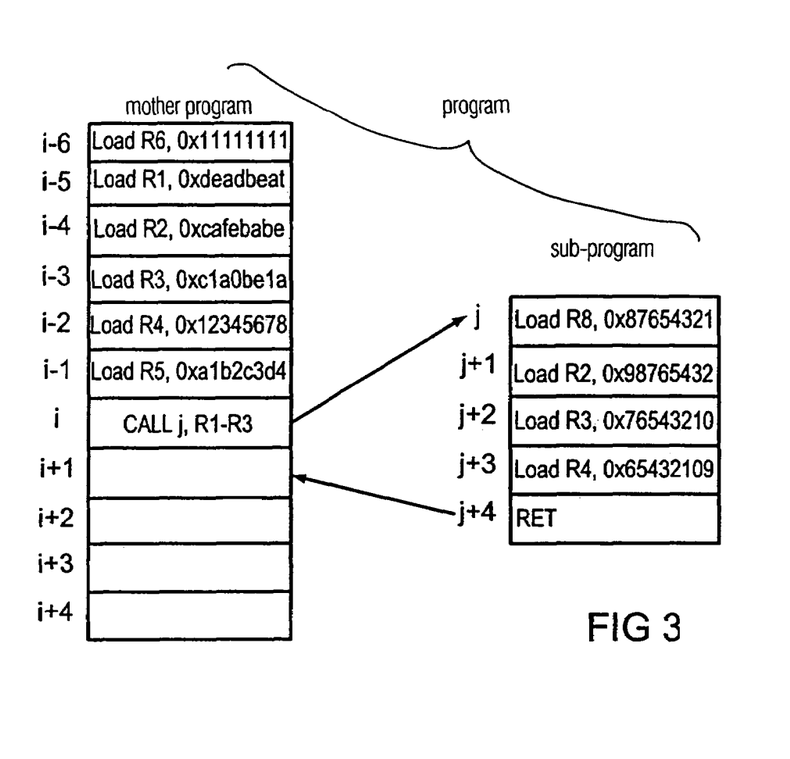
FIG. 3 a schematic drawing, which illustrates an embodiment of a program made up of mother program and sub-program.

FIG. 3 shows an exemplary program part to be processed. The square boxes indicate command lines of the program, wherein one command is contained in every command line. As can be seen, the program to be processed is divided into a first part, i.e. the mother program, and a second part, i.e. the sub-program. The mother program is disposed in a linear way according to an execution sequence, wherein the command lines are numbered from i−6 to i+4. The command lines i−6 to i+4 of the mother program are for example, stored one after the other in the physical memory of the program memory. In the case of a virtual address management, for example via a MMU (MMU =memory management unit) it is, however, possible that the linear structure of the mother program is merely present in the virtual address space. Like the mother program, the commands and command lines, respectively, of the sub-program are structured in a linear way and numbered with j to j+4 exemplarily. The sub-program is stored in another location in the physical program memory. As an example, it has been assumed that load commands are in the command lines i−6 to i−1, which write or load the registers R1-R6 with contents from external memory addresses (0x . . . )

In FIG. 3 it is assumed exemplarily that a sub-program jump command (call) is in the command line i of the mother program, which has as a first operand the destination address of the command line j of the sub-program and as a second operand an explicit indication of registers to be backed up ("R1-R3"). As has already been described with reference to FIG. 1, processing the program by the processor changes to the sub-program by setting the program counter 20 (FIG. 1) to the destination address of the command line j, so that the program is continued at the command line of j of the sub-program. It is shown exemplarily that the command lines j to j+3 contain load commands, which write to the registers R8 and R2 to R4.

Exemplarily, FIG. 3 further shows that a return command (RET) is provided in the command line j+4 of the sub-program. The return command merely comprises an operation, code but no operand. When the return command occurs, the processor fetches the subsequent address of the command line i+1 of the mother program, which succeeds the command line of the sub-program jump command, from a return stack (not shown in FIG. 1) particularly provided therefore, into which, as usual, the processor has entered the program counter value at the jump command in the command line i. From thereon, processing the program is continued again within the mother program from the command line i+1 on.

Apart from these measures concerning the processing sequence, register back-up and restoring measures, respectively, are taken in the sub-program jump command in line i and in the return command j+4, to back-up and to restore, respectively, the registers (R1-R3) indicated within the back-up information of the sub-program jump command, which will be required in the mother program after processing the sub-program.

To illustrate this, the contents of the internal registers and the back-up stack of the processor processing the program of FIG. 3 are shown exemplarily in FIGS. 4a-4d.

In the embodiment of FIGS. 4a-4d, it is assumed for simplicity reasons that there are merely eight internal registers R1-R8 and that the back-up stack has eight memory locations. FIG. 4 illustrates exemplarily the condition, which has occurred until the occurrence of the sub-program jump command in the command line i of the mother program. As can be seen, the contents A, B, C, a, b and c have been written to the internal registers R1-R6. The capital letters are to indicate that the contents will still be required after processing the sub-program, while the contents written in low script will be no longer required, since they represent, for example, merely temporary counter values. The back-up stack is to be empty.

Figure 5:
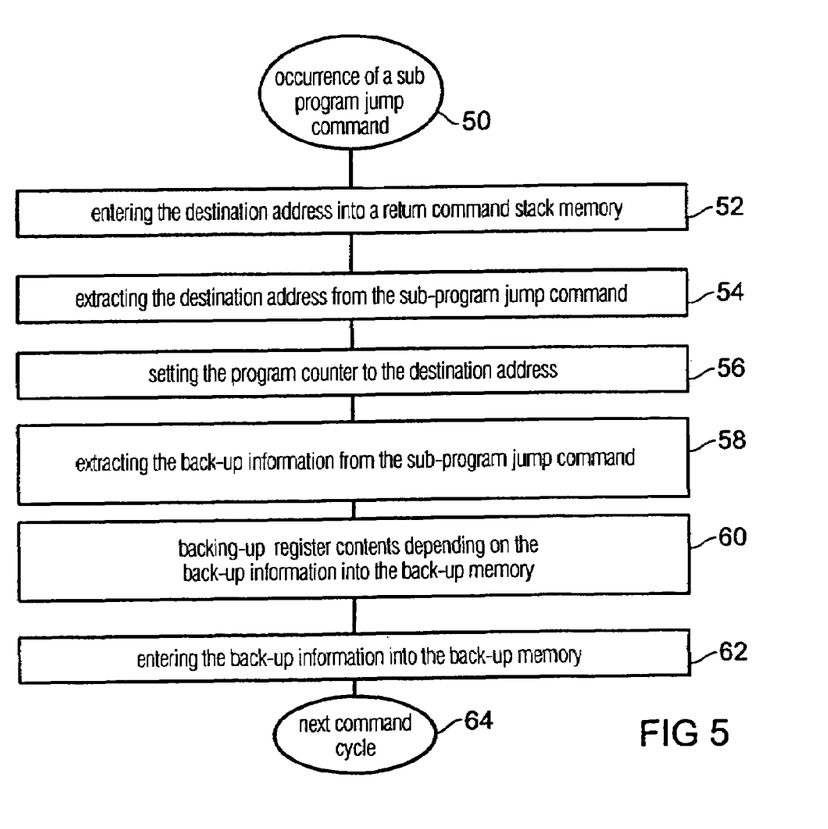
FIG. 5 a flow diagram of a sub-program jump command cycle according to an embodiment of the present invention.

Having arrived at the sub-program jump command in command line i, the sub-program jump command cycle illustrated in FIG. 5 takes place in the processor, wherein in the description of FIG. 5 reference is made to FIG. 1, when this is useful. As soon as the sub-program jump command from the command line i gets into the command decoder 18 as the command currently to be processed, it reports the occurrence of a sub-program jump command to the command processing means 16. Further, through the increment signal, the command decoder 18 provides for an incrementation of the program counter 20 corresponding to the number of address positions, which corresponds to the length of the sub-program jump command.

In step 52, the processor 10 provides for the program counter value of the program counter 20 being entered into a return command stack (not shown in FIG. 1), which corresponds to the address of the sequence command of the sub-program jump command in the mother program, i.e. the address of command line i+1. In step 54, the command decoder 18 extracts the destination address from the sub-program jump command and forwards it to the command processing means 16. Then, the command processing means 16 sets the program counter 20 to the destination address in step 56. In that way it is effected that the subsequent execution of the program is continued at the sub-program. Then, in step 58, the command decoder 18 extracts the back-up information (R1-R3) from the sub-program jump command. In the example of FIG. 3, the back-up information indicates that the register contents of registers R1-R3 are data to be backed up. Then, in step 60, the command processing means 16 backs up the register contents of the registers indicated by the back-up information in the back-up memory, by entering register contents of the indicated registers in a predetermined sequence into the back-up stack 14 (FIG. 1). Then, in step 62, the command processing means 16 enters the back-up information into the back-up stack. This serves to ensure in the return command, which does not need to have an operand, that during reconstruction and restorage, respectively, of register contents, they are written again into the internal registers where they originate.

Figure 4A:
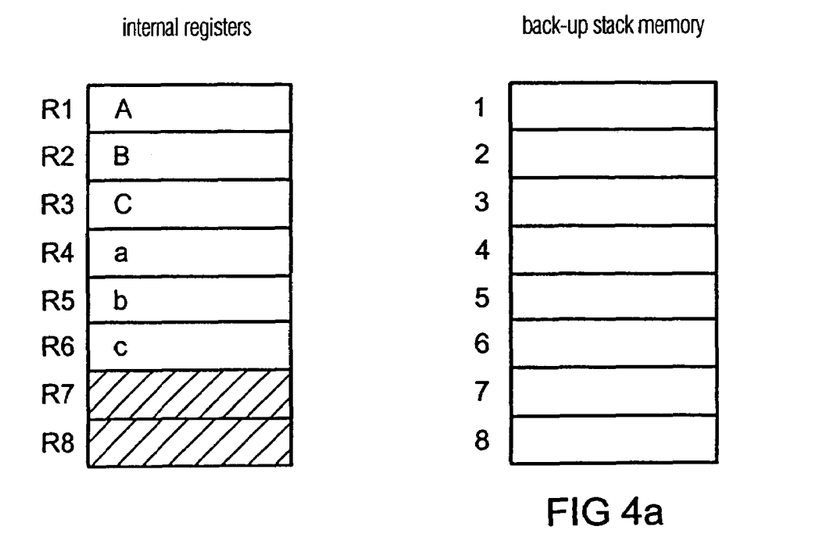
FIGS. 4a to 4d are schematic representations of the content of internal registers and a back-up stack during subsequent situations in processing the program of FIG. 3 according to an embodiment of the present invention.
Figure 4B:
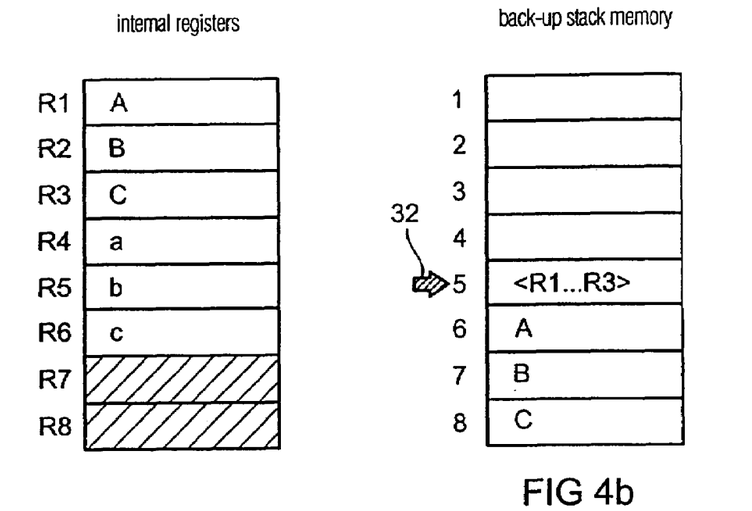

A condition, which appears after step 62 in the example of FIG. 3, is illustrated in FIG. 4b. The back-up stack contains the register contents of the registers R1, R2 and R3 indicated by the back-up information, namely A, B and C, in the lowest memory locations 6-8, wherein the register contents were entered into the back-up stack in the sequence of larger register number to smaller register number. The back-up information (R1-R3) is in the top memory location 5 of the back-up stack, there is.

After performing the sub-program jump command cycle 30, the next command cycle 30 begins, which again begins with decoding the currently to be processed command, in this case the command which is at the destination address, namely, in the example of FIG. 3, in the command line j of the sub-program.

Figure 4C:
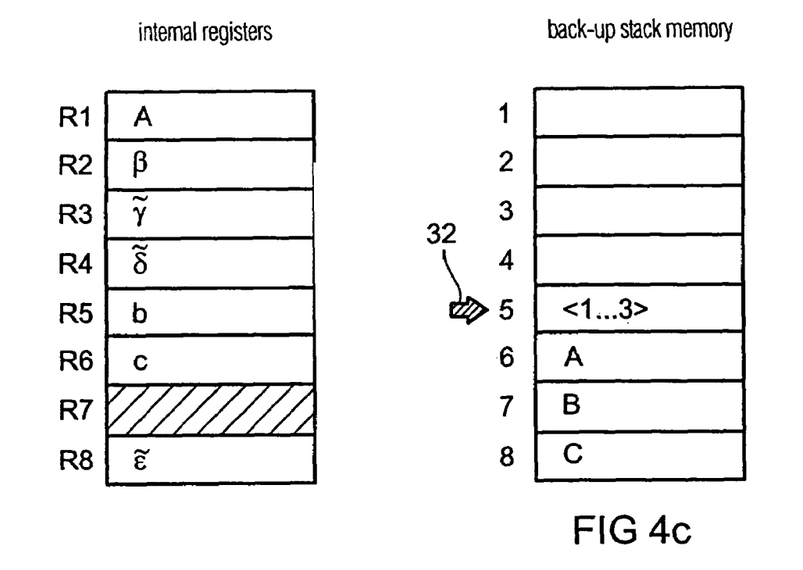

FIG. 4c shows the condition, which appears after processing the sub-program until the occurrence of the return command in the command line j+4 in the sub-program. As can be seen, the register contents of the internal registers R2-R4 have been overwritten with the contents β, γ and δ. Above that, the value ε has been entered into the register R8.

Upon occurrence of the return command, indicated by the command decoder 18 of the processing means 16, the latter reads out the address last entered, in step 52, namely the address of command line i, from the return stack, and enters it into the program counter 20. Further, the command processing means 16 reads the last entered value, as it is indicated by the stack pointer 32 from the back-up stack, namely the back-up information of the last sub-program jump command, namely R1-R3. From the back-up information, the command processing means 16 particularly obtains information about how many register contents have been entered in to the back-up stack in the last sub-program jump command, and how many memory locations of the back-up stack have to be read out, respectively, and further, where these register contents backed-up there have to be written to, and into which internal registers these register contents have to be written, respectively. At present, the back-up information indicates that three register contents have to be read from the back-up stack, namely A, B and C. Further, the back-up information indicate by the convention of the entering sequence when backing-up (step 60) the register contents to be backed up in the back-up stack, which backed-up register contents are to be written into which internal register, namely, at present, A in R1, B in R2 and C in R3.

Figure 4D:
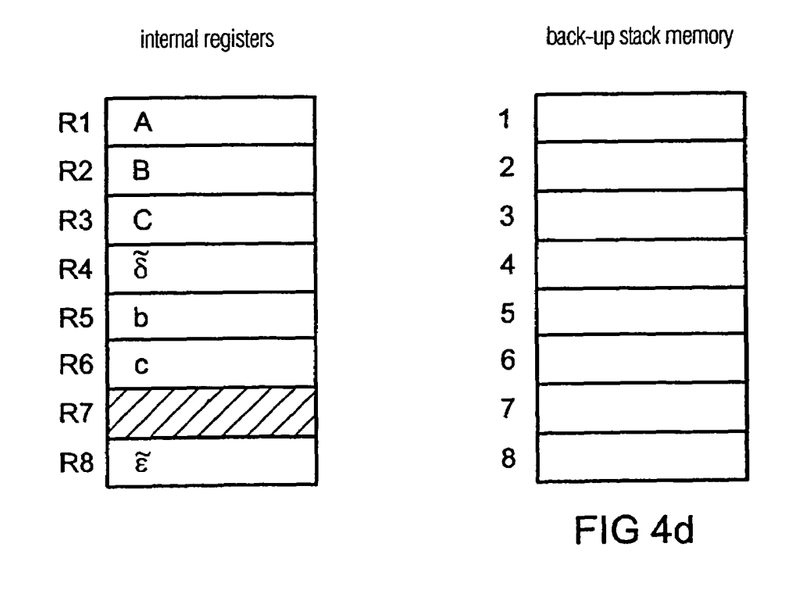

The resulting condition is shown in FIG. 4d. The internal registers R1-R3, into which intermediate results, which should be available after the sub-program, have been stored prior to the sub-program call during processing the sub-program, have been restored with regard to their register contents. The register content R4 differs from the one prior to the sub-program call, which is, however, insignificant, since it is not required for the further processing of the mother program (otherwise, R4 would have been contained in the back-up information). The back-up stack is empty again.

Figure 6:
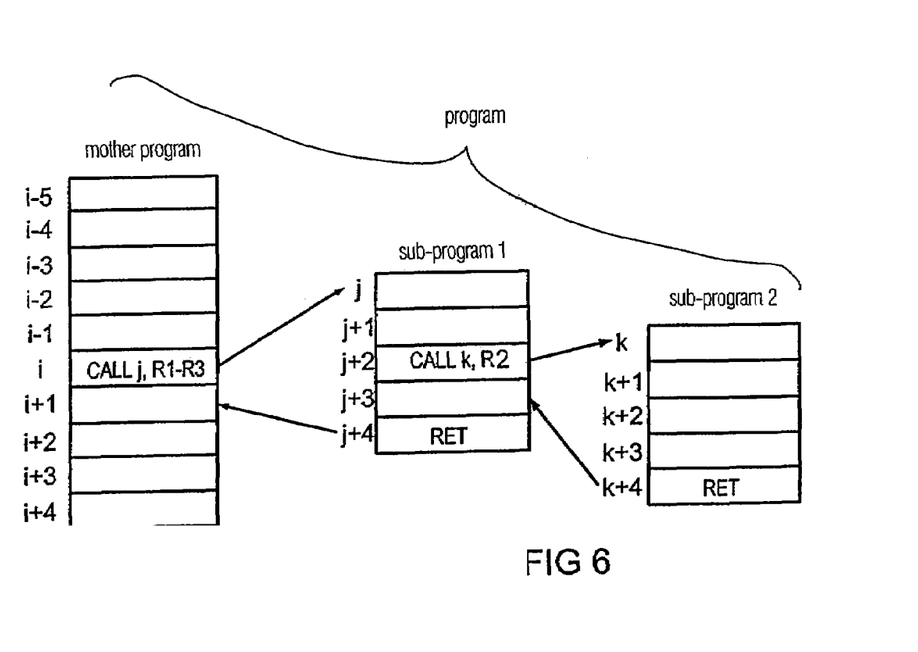
FIG. 6 a schematic drawing, which illustrates a program split up into three hierarchy levels.
Figure 7:
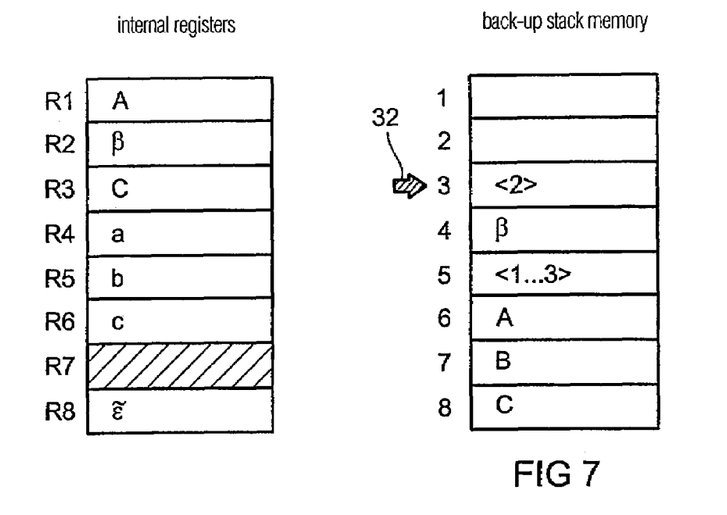
FIG. 7 a schematic diagram, which illustrates the contents of internal registers and a back-up stack according to a sub-program jump command from the higher level sub-program to the lower level sub-program.

In FIG. 6, another embodiment of a program to be processed is shown, which merely serves to illustrate that sub-program embodiments can be nested, i.e. that a further sub-program from a called sub-program can be called. The embodiment of FIG. 6 differs from the one of FIG. 3 merely by the fact that it is assumed that a further sub-program jump command is present in the command line j+2 of the sub-program. The content of internal registers RL-R8 and memory locations of the back-up stack, which result in command line j+2 after processing the jump command, are shown in FIG. 7.

In the sub-program of lines j to j+4, which is like a mother program to the called sub-program from the command lines to k to k+4, the content of registers R2 and R8 in the command line j+2 has already been changed to β and ε until the occurrence of the sub-program jump command. The tilde is to indicate that the respective content in the register is not required in the sub-program of the first call hierarchy (j-j+4) after processing the called sub-program of the second call hierarchy (k-k+4). Correspondingly, the sub-program jump command contains as back-up information in the command line j+2 only information that indicates the register R2. Accordingly, in processing the sub-program jump command, the register content of the indicated internal register R2 has been entered into the back-up stack at the next free location in the back-up stack, namely memory location 4. Additionally, the back-up information of the second sub-program jump command, namely R2, has been entered into the last and upmost memory location of the back-up stack, respectively, to which the stack pointer 32 points as well. In that way, even in a nested sub-program, the data of the respective mother programs to be backed up are "stored", wherein by additional storage of the respective back-up information a correct restoration of the register contents is ensured in the subsequent return.

Figure 8:
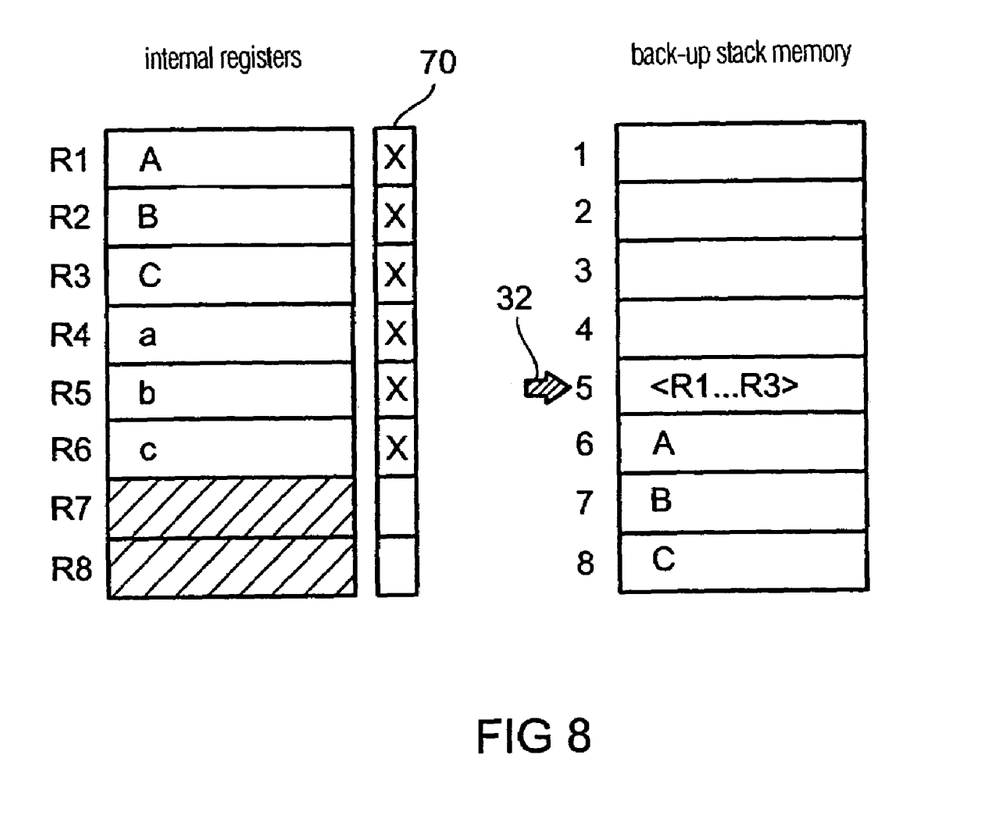
FIG. 8 a schematic diagram, which illustrates the condition of the internal registers and the back-up stack as it results during processing the program of FIG. 3 after processing the sub-program jump command.

In the above embodiments, merely the back-up information in the sub-program jump command served to clearly identify those internal registers, whose register contents were to be stored in the back-up memory 14. Thus, by the explicit indication of the registers to be backed-up, under the assumption of a limited set of registers, always the registers not to be backed-up were determined as those which did not belong to the indicated ones. In the embodiment described with reference to FIG. 8, the back-up information is linked to automatically up-dated logging information to indicate the register content to be backed-up. FIG. 8 shows the condition of the internal registers R1-R8 and the back-up stack, as it results during processing the program of FIG. 3 after processing the sub-program jump command in line i, wherein, however, an automatic recognition of used internal registers is used, as it will be described below.

As it can be seen, in the internal registers and in the back-up stack, the same condition occurs as in the embodiment, which has been described with reference to FIGS. 4a-4d, namely the same condition as in FIG. 4b. Additionally, however, a register 70 is shown in FIG. 8, wherein one flag is provided per register. In that embodiment, the command processing means is adapted such that, during every storage of an intermediate result in an internal register R1-R8 it sets the flag corresponding to that register, if it has not been set already. In the present case, as indicated by small crosses, the flags of registers R1-R6 used up to then are set.

In the embodiment of FIG. 8, however, the back-up information of the sub-program jump command in the command line i does not indicate explicitly those registers to be backed up, but merely those to be explicitly excluded from back up, since they are not required in further processing the mother program after processing the sub-program, here the registers R4-R8. Accordingly, the sub-program jump command cycle differs from the one described with reference to FIG. 5 merely in that in the step of entering 62 not the back-up information itself is stored in the back-up stack, which merely indicates the registers R4-R8 not to be backed up, but the registers R1-R6 indicated by the automatic recognition and the set flags, respectively, minus those that are explicitly excluded from back-up by back-up information, namely R4-R8. In this case, like in the embodiment of FIGS. 4a-4d, the registers R1-R3 result, i.e. all registers not excluded from back-up, which have been used prior to the occurrence of the sub-program jump command.

After having described above the inventive concept of backing-up data during processing sub-programs with regard to embodiments based on the figures in an illustrative way, in the following, more specific embodiments for sub-program jump commands are provided, which differ either by the encoding of the back-up information in the back-up information field (see FIG. 2) or the way how they are interpreted in the command processing means 16.

As already described in the embodiment of FIGS. 4a-4d, a first possibility for indicating the register contents to be backed up is the explicit indication of the register contents to be backed up and the explicit indication of those registers, whose register contents are to be backed up, respectively. A sub-program jump command of this type could be written in normal notation, such as is illustrated in FIG. 3, as "call <jump address>, Rx, Ry . . . ", the sub-program jump command which causes the continuation of the program processing at the destination address and jump address, respectively, with backing-up the register contents and the registers Rx, Ry, . . . .

It is another possibility that the back-up information of sub-program jump command indicate the register contents explicitly not to be backed up, and those registers, respectively, whose register contents are not to be backed up, such as it has been the case in the embodiment of FIG. 8. A possible notation for such a sub-program jump command would be, for example, "call <destination address>, /rx, /ry, . . . ", a sub-program jump command, which would cause a jump to the destination address and the back-up of all or, in the case of the automatic recognition of the used registers of all used internal registers, with the exception of the registers marked with "/".

In both previous embodiments, which means the one, where the register contents to be backed up are explicitly shown, and the one, where the register contents not to be backed up are explicitly shown, the security information can be a mask which has one bit per register, in the examples of FIGS. 4a-4c therefore, for example 8 bits. Every bit is associated to a register. In an explicit indication of the register to be backed-up, the bits, which are linked to a register to be backed-up, can be, for example, logically high, while the bits, which are linked to the other registers, are logically low. In the explicit indication of the registers to be excluded from backing-up, the bits, which are linked to a register not to be backed-up, are, for example, logically high, while the bits, which are linked to the other registers, are logically low. The back-up information of the sub-program jump command of the embodiment of FIG. 3 could then be indicated, for example, by mask "11100000" and the information of the sub-program jump command of the embodiment of FIG. 8 by the mask of "00011111", wherein the first bit from the left is associated to the register R1, the second bit from the left is associated to the register R2, respectively, etc. Thus, in this embodiment, the back-up information field of the command would be a mask which differs from sub-program jump command to sub-program jump command. This mask could serve to being stored in the back-up stack (step 62).

Instead of the mask bit register association of the previous embodiment, it is further possible to define an order among the internal registers for the encoding of register contents explicitly to be backed-up and explicitly not to be backed-up, respectively, which can then be utilized for a more efficient encoding requiring less bits. A simple variation of this principle is the simple linear sorting of the internal registers. In the previous embodiments, for example, the registers are ordered in a linear way by their numbering.

In this embodiment, the back-up information has, for example, merely the indication of a register and the order rank. Per convention and definition, respectively, of the sub-program jump command operation, the command processing means knows, for example, that together with the register indicated by the back-up information, all registers higher order and registers with a higher index, respectively, or alternatively, all registers lower order and with a lower index, respectively, should be considered as explicitly indicated to count as to be backed up and not to be backed-up, respectively. In the embodiment of FIGS. 4a-4d it is, for example, sufficient when the back-up information indicates the register R3, whereby the command processing means backs up, for example, by convention, all registers with lower index, i.e. R1 and R2, together with the indicated register R3 in the back-up memory. An actual encoding of the back-up information would then be, for example, a binary 4-bit word of "0011", i.e. the binary encoding of 3. In the embodiment of FIG. 8, it is, for example, sufficient when the back-up information of the sub-program jump command indicates the register R4, whereupon the command processing means excludes, for example by convention, together with the indicated register, all registers with the same or a higher index from backing-up. In this case, the back-up information can be encoded by the bit word "0100", i.e. the binary representation of 4.

Of course, other structuring schemes than the linear one, which has been described above, are possible for the internal registers and are possibly to be preferred, depending on usage and architecture of the processor. In the 88 architecture, for example, 16 address registers and separated therefrom 16 data registers exist. In this case, the back-up information field (see FIG. 2) could be divided into two sub-fields, one of which contains back-up information for the address register and the other one backup information for the data register. The encoding and convention with regard to the interpretation of the back-up information for both register types would of course be possible according to all previously-described embodiments. A command of, for example, call <jump address>, D5, A13 could indicate, for example, that all data register Dx with an index higher or equal to 5 and all address registers with an index of 13 or higher are backed-up in the back-up stack.

A person skilled in the art will easily understand that the above embodiments can be combined in a processor as required. On the one hand, merely an inventive sub-program jump command could be contained in the command set of the processor, whose encoding and interpretation is adapted to the use of the processor. Further, however, multiple sub-program jump command types could be present in the command set, which differ then by their operation code. Based on the operation code, the command processing means can decide how the back-up information is to be interpreted, i.e. first as bit mask or binary indication of a register index, from or up to which all registers are to be counted as explicitly indicated, second as explicit indication of the registers to be backed up (FIG. 4) or not to be backed up (FIG. 8), and third as indication to be linked to the flags indicating the used registers (FIG. 8) or as individual indication(FIG. 4).

Consequently, with the above-described embodiments for backing-up the register contents during processing sub-programs, an optimization of the command sequence can be obtained in the program for automatically backing-up context data in the calling of sub-programs. Particularly, the embodiments facilitate an efficient selection of the data to be backed up, which means having a short code length. Apart from the obligatory destination address The illustrated sub-program jump commands and program branch commands, respectively, contain one or several parameters for identifying data to be backed up as operands, which initiate an automatic back-up with the execution of the command. By a clever organization of the data entering the memory requirement for backing-up the data can be optimized.

Particularly in the above-named definition of a linear sequence among the internal registers and the explicit indication of register contents to be backed up or not to be backed up by indicating merely one register index, an optimum utilization of the back-up stack memory capacity can be obtained, by, for example, writing data, which are required after processing the sub-program, into the registers starting from the lowest index, while data, which are not required after processing the sub-program, are written into the registers starting from the register with the highest index.

In comparison to the possibility of automatic recognition of the used registers for determining the register contents to be backed-up as described in the introductory portion of the specification, the advantage results that software tools, such as compilers, are allowed a better utilization of the back-up memory with the same requirement of program code memory when generating the command sequences and the actual program code, respectively. In the embodiment of FIG. 8, where the automatic recognition of used registers has been linked, for example, to the explicit indication of register contents not to be backed up, storing of data, which are merely required temporarily, but not after processing the sub-program, is avoided.

Accordingly, the invention enables, on the one hand, an optimization of the memory requirement for the program code of a processor, and, on the other hand,. a simultaneous reduction of the requirement of data storage for data to be backed up when using program branch commands.

With regard to the above description, it should be noted that although in the above merely internal registers of the processor have been the object of the backing up during the processing of such programs, further, memory locations of any type can be memory location of the eventually to be backed-up information and data, respectively. Further, the back-up stack memory could be disposed in the processor itself. Further, the back-up stack memory could operate other than according to the stack memory principle. Additionally, different other possibilities for managing the program counter and the definition of command operation exist. Additionally, encoding schemes with variable lengths could be used for the encoding of the registers indicated explicitly as to be backed up or not to be backed up, respectively.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A processor for processing a program with commands, the program comprises a mother program with a sub-program jump command and a sub-program, which is to be executed in response to the sub-program jump command, comprising:
   a command processor adapted to, upon the occurrence of the sub-program jump command in the mother program,
      extract, from the sub-program jump command, back-up information about data required in the mother program after processing the sub-program;
      back-up, based on the back-up information, the data required in the mother program after processing the sub-program;
      extract a destination address referring to the sub-program from the sub-program jump command;
      effect, based on the destination address, the processing of the program to be continued with the sub-program; and
   a log unit adapted to set a mark for every memory location, to which an intermediate value has been stored during the processing of the mother program,
   wherein the command processor is adapted to back up the intermediate results of those memory locations during back up for which a mark is set, minus the intermediate result of those memory locations which are indicated by the back-up information.

2. The processor according to claim 1, wherein the processor has a command set of several command operations clearly identifiable by operation codes, wherein a sub-program jump command operation is among the command operations, which is identified clearly by a sub-program jump command operation code, and wherein every command of the program has an operation code, by which it can be associated with a command operation, wherein the processor further comprises:
   a command decoder for decoding a currently to be processed command of the mother program to obtain its operation code, and for reporting the occurrence of the sub-program jump command to the command processor, if its operation code is equal to the sub-program jump command operation code, and wherein the sub-program jump command has the destination address and the back-up information as operands.

3. The processor according to claim 2, wherein among the commands of the mother program and the sub-program an execution order is defined, respectively, and the processor is adapted to perform, based on the execution order, processing the program, wherein every command has exactly one operation code, by which it can be associated with one of the command operations.

4. The processor according to claim 3, wherein the processor is adapted to perform every command of the program in one of successive command cycles, wherein the command processor is adapted to perform extraction, back-up and effecting in a single command cycle.

5. The processor according to claim 1, further comprising:
   memory locations for storing processor intermediate results while processing the program, wherein the data required in the mother program after processing the sub-program are made up of the processor intermediate results of a selection of memory locations, wherein the selection depends at least partly on the back-up information.

6. The processor according to claim 5, wherein the back-up information indicates at least one memory location which belongs to the selection, wherein no other memory location belongs to the selection.

7. The processor according to claim 5, wherein the back-up information indicates at least one memory location, which does not belong to the selection.

8. The processor according to claim 7, wherein all other memory locations belong to the selection.

9. The processor according to claim 7, wherein the selection depends additionally on usage information, which indicates which of the memory locations has been used for storing intermediate results during the processing of the mother program until the occurrence of the sub-program jump command, such that the selection comprises those memory locations which are indicated by the usage information, but not by the back-up information.

10. The processor according to claim 1, wherein the command processor is adapted to enter the data into a stack memory in the back-up of the data required after processing the sub-program in the mother program.

11. The processor according to claim 10, wherein the command processor is adapted to enter the back-up information together with the data while entering the data in the stack memory.

12. The processor according to claim 2, wherein the sub-program comprises a return command and wherein the command set further comprises a return command operation, which can be identified by a unique return command operation code, wherein the command decoder is adapted to report the occurrence of the return command to the command processor, in a case that the operation code of the currently to be processed command matches the return command operation code, wherein the command processor is adapted to restore the backed-up data based on the stored backed-up information upon occurrence of the return command.

13. The processor according to claim 1, wherein the back-up information comprises a bit word, which comprises a plurality of bits, each of which is associated with one of the memory locations, wherein all bits, which are associated with memory locations, which are to be stored, or all bits, which are associated with memory locations, which are not to be stored, have a first logic state, while the other bits have a second logic state opposite to the first logic state.

14. The processor according to claim 13, wherein the command processor is adapted to back-up intermediate results of those memory locations during back up, which are associated with the bits which have the first logic state, and to not back up intermediate results of those memory locations which are associated with the bits, which have the second logic state, or, on the contrary, to not back-up the intermediate results of those memory locations, which are associated with the bits, which have the first logic state, and to back-up the intermediate results of those memory locations, which are associated with the bits which have the second logic state.

15. The processor according to claim 5, wherein a ranking is defined among the memory locations, which indicates a memory location with a certain rank to back-up information, and those memory locations, which are to be backed up or the memory locations, which are not to be backed up are either memory locations with a higher or lower rank than the certain rank.

16. A method for processing a program with commands comprising a mother program with a sub-program jump command and a sub-program, which is to be executed in response to the sub-program jump command, comprising:

upon occurrence of the sub-program jump command in the mother program, by the command processor,
  extracting, from the sub-program jump command, back-up information about data required in the mother program after processing the sub-program;
  backing-up, based on the back-up information, data required in the mother program after processing the sub-program;
  extracting a destination address from the sub-program jump command, the destination address referring to the sub-program;
  effecting, based on a destination address, the processing of the program to be continued with the sub-program;
 setting a mark for every memory location, to which an intermediate value has been stored during the processing of the mother program; and
 backing up the intermediate results of those memory locations during back up for which a mark is set, minus the intermediate result of those memory locations which are indicated by the back-up information.

17. A processor for processing a program with commands, the program comprises a mother program with a sub-program jump command and a sub-program, which is to be executed in response to the sub-program jump command, comprising:

a command processing means adapted to, upon the occurrence of the sub-program jump command in the mother program,
  extract, from the sub-program jump command, back-up information about data required in the mother program after processing the sub-program;
  back-up, based on the back-up information, the data required in the mother program after processing the sub-program;
  extract a destination address referring to the sub-program from the sub-program jump command; and
  effect, based on the destination address, the processing of the program to be continued with the sub-program;
 memory locations for storing processor intermediate results while processing the program, wherein the data required in the mother progran after processing the sub-program are made up of the processor means intermediate results of a selection of memory locations, wherein the selection depends at least partly on the back-up information; and
 a log means for setting a mark for every memory location, to which an intermediate value has been stored during die processing of the mother program,
 wherein the command processing means backs up the intermediate results of those memory locations during back up for which a mark is set, minus the intermediate result of those memory locations which are indicated by the back-up information.

* * * * *